United States Patent [19]
Seo

[11] Patent Number: 6,009,030
[45] Date of Patent: Dec. 28, 1999

[54] SENSE AMPLIFIER ENABLE SIGNAL GENERATING CIRCUIT OF SEMICONDUCTOR MEMORY DEVICES

[75] Inventor: Myoung-Kyu Seo, Ich'on, Rep. of Korea

[73] Assignee: Hyundai Electronics Industries Co., Ltd., Kyoungki-do, Rep. of Korea

[21] Appl. No.: 08/995,637

[22] Filed: Dec. 22, 1997

[30] Foreign Application Priority Data

Dec. 28, 1996 [KR] Rep. of Korea ........................ 96-75443

[51] Int. Cl.$^6$ ....................................................... G11C 7/00
[52] U.S. Cl. ........................... 365/205; 365/207; 365/194; 327/51
[58] Field of Search ...................................... 365/205, 207, 365/194; 327/51

[56] References Cited

U.S. PATENT DOCUMENTS

| | | | |
|---|---|---|---|
| 4,766,572 | 8/1988 | Kobayashi | 365/190 |
| 5,243,573 | 9/1993 | Makihara et al. | 365/205 |
| 5,247,483 | 9/1993 | Okamoto | 365/205 |
| 5,481,500 | 1/1996 | Reohr et al. | 365/194 |
| 5,504,443 | 4/1996 | Gross et al. | 327/51 |
| 5,523,978 | 6/1996 | Yoon et al. | 365/229 |
| 5,561,629 | 10/1996 | Curd | 365/185.21 |
| 5,594,695 | 1/1997 | Yim et al. | 365/205 |

*Primary Examiner*—Huan Hoang
*Attorney, Agent, or Firm*—Ware, Fressola, Van Der Sluys & Adolphson LLP

[57] ABSTRACT

A sense amplifier enable signal generating circuit of a semiconductor memory device includes: a sense amplifier enable signal generating section for receiving an input signal externally applied, and generating a sense amplifier enable signal; a delay section for delaying the sense amplifier enable signal generated from the sense amplifier enable signal generating section; a detecting section for detecting the variation of a power supply voltage in accordance with a control signal externally applied, and generating a detection signal for the variation; a transfer section for transferring the delayed sense amplifier enable signal of the delay section in accordance with the detection signal generated from the detecting means; and an output section for receiving the sense amplifier enable signal generated from the sense amplifier enable signal generating means and the delayed sense amplifier enable signal of the delay section, and generating an output signal having a constant pulse width.

16 Claims, 3 Drawing Sheets

SENSE AMPLIFIER ENABLE SIGNAL GENERATING CIRCUIT OF SEMICONDUCTOR MEMORY DEVICES

BACKGROUND OF THE INVENTION

Field of the Invention

The present invention relates to a semiconductor memory device and, more particularly, to a sense amplifier enable signal generating circuit of a semiconductor memory device capable of generating a sense amplifier enable signal having a constant pulse width irrespective of the variation of a power supply voltage.

Discussion of Related Art

FIG. 1 is a circuit diagram of a sense amplifier enable signal generating circuit in a semiconductor memory device according to prior art. Referring to FIG. 1, the sense amplifier enable signal generating circuit has multistage delay means 11–13 for delaying an equalization signal EQ externally applied, and generating a sense amplifier enable signal SE.

Each of the delay means 11–13, comprising inverters IN and capacitors C, generates the sense amplifier enable signal SE having a desired pulse width.

In the conventional sense amplifier enable signal generating circuit, with the power supply voltage changing, the delay time delayed through each of the delay means 11–13 is varied and the pulse width of the sense amplifier enable signal SE changes with variation of the delay time. Thus the pulse width of the sense amplifier enable signal is not enough against the delay caused by the bit line capacitance and the word line capacitance at a low power supply voltage $V_{cc}$, so that a malfunction occurs in the data sensing operation.

The pulse width of the sense amplifier enable signal may be incremented properly according to the low level of the power supply voltage to overcome the problem, but the operating current $I_{cc}$ increases at a high power supply voltage, resulting in a large power dissipation.

SUMMARY OF THE INVENTION

Accordingly, the present invention is directed to a sense amplifier enable signal generating circuit of a semiconductor memory device that substantially obviates one or more of the problems due to limitations and disadvantages of the related art.

An object of the present invention is to provide a sense amplifier enable signal generating circuit of a semiconductor memory device being capable of generating a sense amplifier enable signal having a constant pulse width irrespective of variation of a power supply voltage by increasing the pulse width of the sense amplifier enable signal only at a low power supply voltage.

Another object of the present invention is to provide a sense amplifier enable signal generating circuit of a semiconductor memory device that generates a sense amplifier enable signal having a constant pulse width without increase in operation current.

Another object of the present invention is to provide a sense amplifier enable signal generating circuit of a semiconductor memory device that secures the sensing margin at a low power supply voltage and prevents a malfunction in the data sensing operation.

Further another object of the present invention is to provide a sense amplifier enable signal generating circuit of a semiconductor memory device that prevents an increase of the power consumption at a high power supply voltage.

To achieve these and other advantages and in accordance with the purpose of the present invention, as embodied and broadly described, a sense amplifier enable signal generating circuit of a semiconductor memory device includes: sense amplifier enable signal generating means for receiving an input signal externally applied, and generating a sense amplifier enable signal; delay means for delaying the sense amplifier enable signal generated from the sense amplifier enable signal generating means; detecting means for detecting the variation of a power supply voltage in response to a control signal externally applied, and generating a detection signal for the variation; transfer means for transferring the delayed sense amplifier enable signal of the delay means in response to the detection signal generated from the detecting means; and output means for receiving the sense amplifier enable signal from the sense amplifier enable signal generating means and the delayed sense amplifier enable signal from the delay means, and generating an output signal having a constant pulse width.

In the sense amplifier enable signal generating circuit of the present invention, the sense amplifier enable signal generating means includes multistage delay means for generating the sense amplifier enable signal by delaying an equalization signal applied as the input signal.

In the sense amplifier enable signal generating circuit of the present invention, the delay means includes delay chains for delaying the sense amplifier enable signal received from the sense amplifier enable signal generating means by a desired pulse width. The delay chain includes: an inverting gate for receiving the sense amplifier enable signal from the sense amplifier enable signal generating means or an output signal from a previous delay chain as an input signal; and a capacitor connected to the output of the inverting gate.

In the sense amplifier enable signal generating circuit of the present invention, the detecting means for detecting the variation of the power supply voltage includes: first means for applying the power supply voltage in response to the control signal externally applied; second means for voltage-dividing the power supply voltage applied through the first means; and third means for receiving the divided power supply voltage through the second means, and detecting the variation of the power supply voltage.

In the sense amplifier enable signal generating circuit of the present invention, the first means of the power supply voltage variation detecting means includes a PMOS transistor driven by the control signal applied at its gate to apply the power supply voltage to the second means. The second means includes a plurality of NMOS transistors used as resistors for dividing the power supply voltage applied through the first means.

In the sense amplifier enable signal generating circuit of the present invention, the third means of the detecting means includes: detecting means for receiving the divided power supply voltage through the second means, and detecting the variation of the power supply voltage to a low voltage to generate the detection signal; and buffer means for applying the detection signal from the detecting means to the transfer means.

In the sense amplifier enable signal generating circuit of the present invention, the detecting means in the third means includes an inverting gate for generating the detection signal in the high logic state only when the power supply voltage is changed to a low voltage within a desired range. The buffer means includes a plurality of inverting gates connected in series for receiving the detection signal, and providing it to the transfer means.

In the sense amplifier enable signal generating circuit of the present invention, the transfer means includes: first means for transferring the delayed sense amplifier enable signal from the delay means to the output means in accordance with the detection signal of the power supply voltage variation detecting means; and second means for shielding the delayed sense amplifier enable signal from the delay means from being transferred to the output means in accordance with the detection signal of the power supply voltage variation detecting means.

In the sense amplifier enable signal generating circuit of he present invention, the first means of the transfer means includes: first PMOS and NMOS transistors which gates receive the detection signal of the power supply voltage variation detecting means, and sources are connected to the power supply voltage and ground respectively; second PMOS and NMOS transistors where the delayed sense amplifier enable signal of the delay means is applied to gates, and sources are connected to drains of the first PMOS and NMOS transistors respectively; and an inverting gate where an input is connected to the drains of the second PMOS and NMOS transistors and an output is connected to the output means.

In the sense amplifier enable signal generating circuit of the present invention, the second means of the transfer means includes a third PMOS transistor where the detection signal of the power supply voltage variation detecting means is applied to a gate, the power supply voltage is applied to a source, and a drain is connected to the first means.

In the sense amplifier enable signal generating circuit of the present invention, the output means includes a NOR gate for carrying out logic NOR operation of the sense amplifier enable signal generated from the sense amplifier enable signal generating means and the delayed sense amplifier enable signal from the transfer means, and generating the output signal having the constant pulse width.

In accordance with another aspect of the present invention, a sense amplifier enable signal generating circuit of a semiconductor memory device includes: sense amplifier enable signal generating means for receiving an equalization signal externally applied, and generating a sense amplifier enable signal; delay means for delaying the sense amplifier enable signal received from the sense amplifier enable signal generating means; detecting means for detecting the variation of a power supply voltage to a low voltage in accordance with a control signal externally applied, and generating a detection signal; transfer means for transferring the delayed sense amplifier enable signal through the delay means in accordance with the detection signal from the detecting means; and, output means for receiving the sense amplifier enable signal from the sense amplifier enable signal generating means and the delayed sense amplifier enable signal from the transfer means, and generating an output signal having a constant pulse width, wherein when the power supply voltage is changed to a low voltage, the transfer means transfers the delayed sense amplifier enable signal from the delay means to the output means in accordance with the detection signal, and the output means generates the output signal by carrying out logic NOR operation of the sense amplifier enable signal from the sense amplifier enable signal generating means and the delayed sense amplifier enable signal from the transfer means; and when the power supply voltage is not changed to a low voltage, the transfer means shields the delayed sense amplifier enable signal from the delay means to the output means, and the output means outputs the sense amplifier enable signal of the sense amplifier enable signal generating means as the output signal.

According to the present invention, if the power supply voltage is not changed, a sense amplifier enable signal generating circuit normally generates a sense amplifier enable signal from a sense amplifier enable signal generating means as an output signal having a constant pulse width. On the other hand, if the power supply voltage is changed to a low voltage, the sense amplifier enable signal generating circuit generates the logic NORed signal of the sense amplifier enable signal from the sense amplifier enable signal generating means and the delayed sense amplifier enable signal by a desired pulse width, as the output signal having the constant pulse width.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Figure 2:
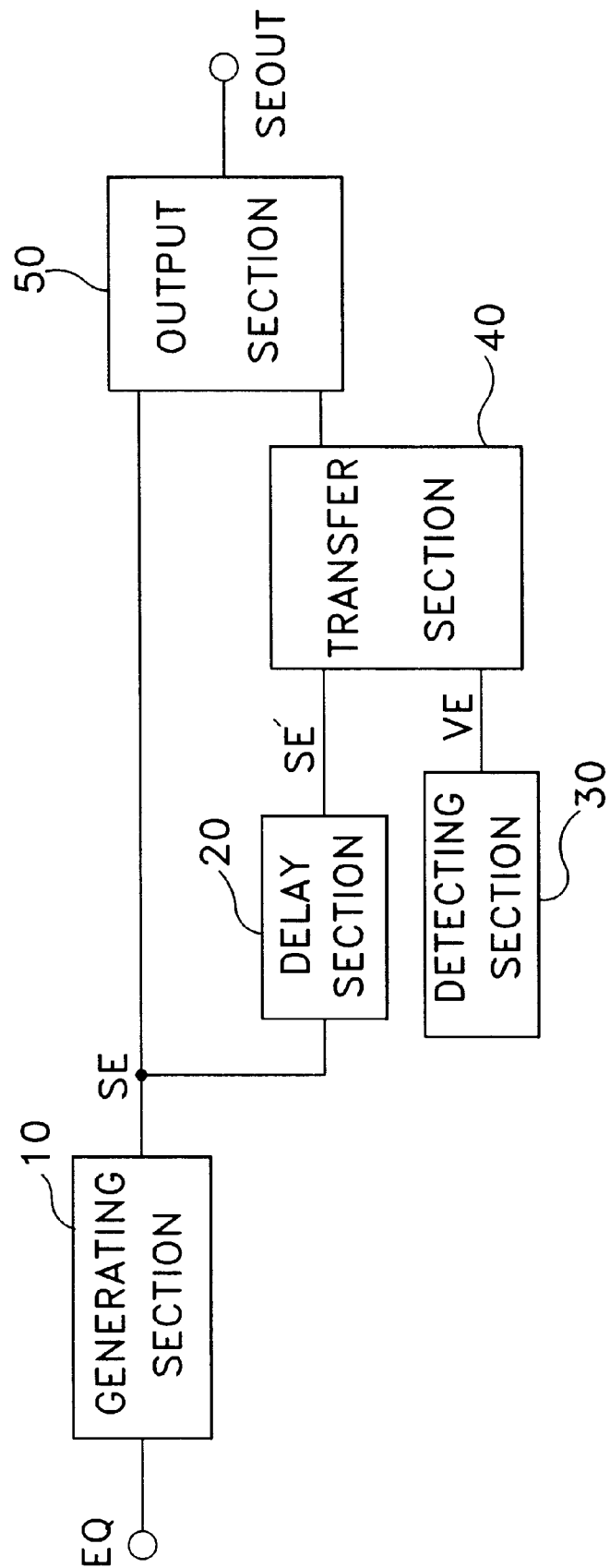
FIG. 2 is a block diagram of a sense amplifier enable signal generating circuit in a semiconductor memory device according to the preferred embodiment of the present invention.
Figure 3:
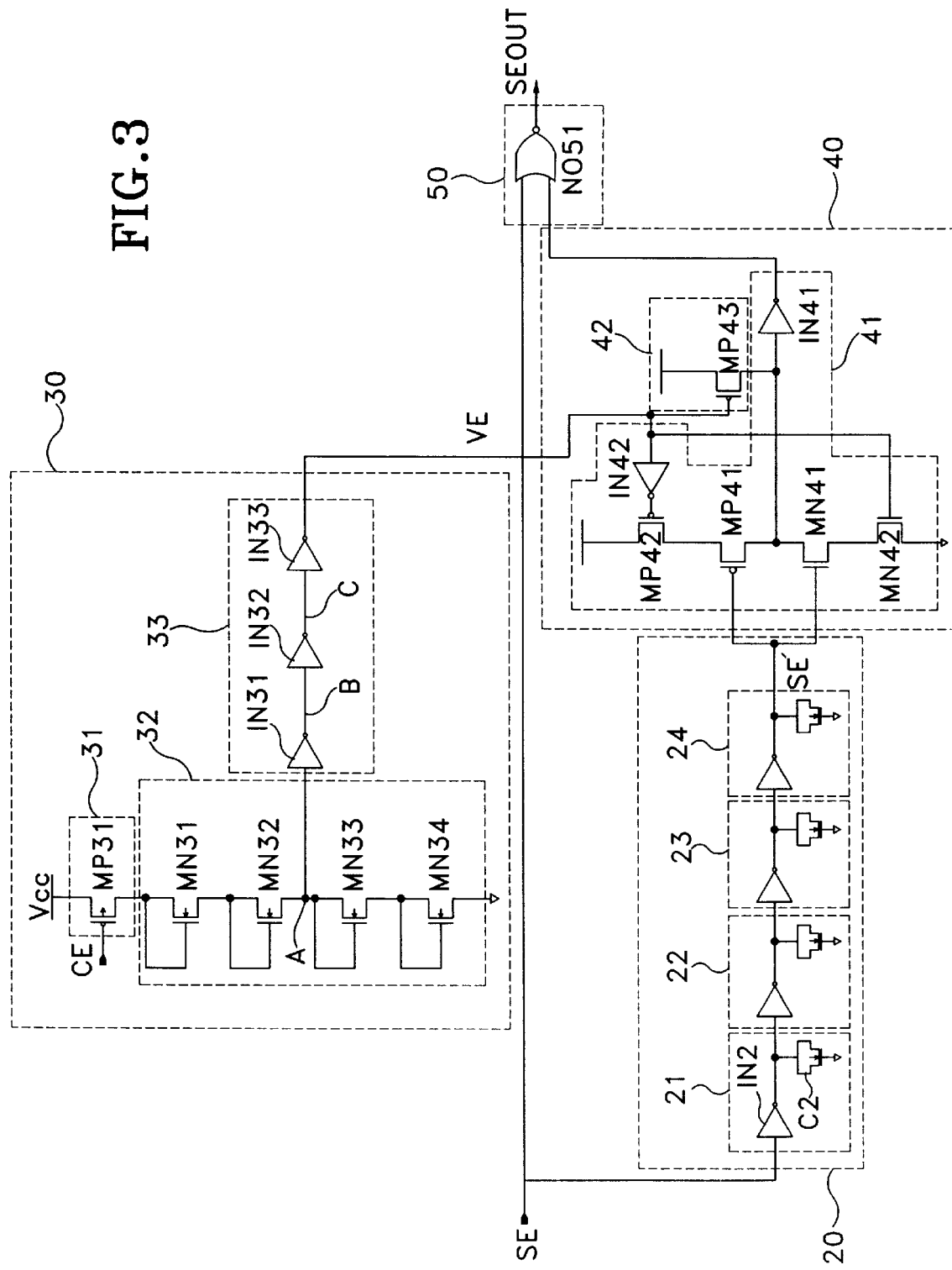
FIG. 3 is a detail circuit diagram of the sense amplifier enable signal generating circuit in FIG. 2.

FIG. 2 is a block diagram of a sense amplifier enable signal generating circuit in a semiconductor memory device according to the preferred embodiment of the present invention. FIG. 3 is a detail circuit diagram of the sense amplifier enable signal generating circuit in FIG. 2.

Figure 1:
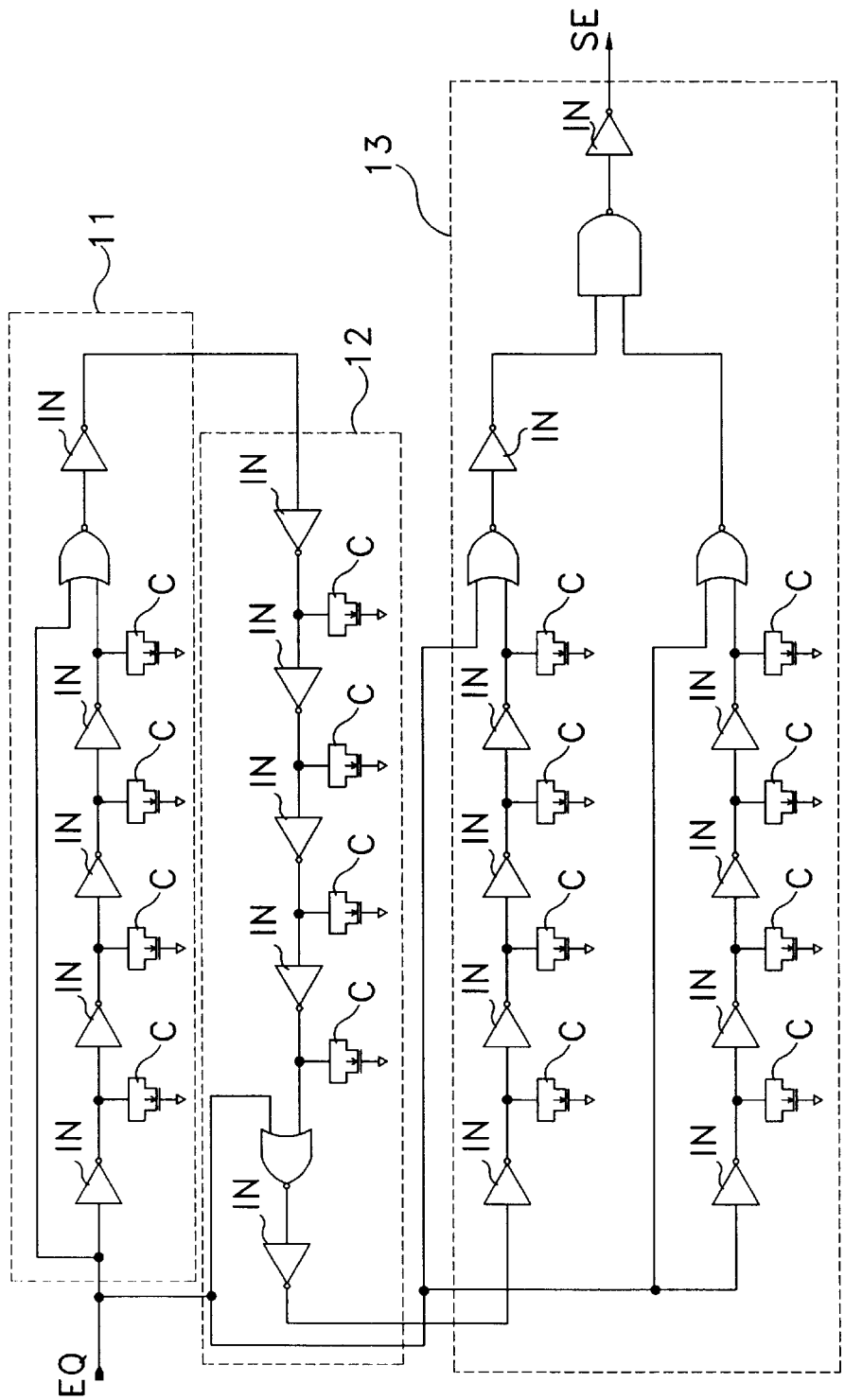
FIG. 1 is a circuit diagram of a sense amplifier enable signal generating circuit in a semiconductor memory device according to prior art.

Referring to FIGS. 2 and 3, the sense amplifier enable signal generating circuit has a sense amplifier enable signal generating section 10 receiving an equalization signal EQ externally applied, and generating a sense amplifier enable signal SE, with the same construction and operation as shown in FIG. 1.

The sense amplifier enable signal generating circuit includes a delay section 20 for delaying the sense amplifier enable signal SE, received from the sense amplifier enable signal generating section 10, by a desired pulse width. The delay section 20 has a plurality of delay chains 21–24, each comprising an inverting gate IN2 and a capacitor C2, for delaying the sense amplifier enable signal SE from the sense amplifier enable signal generating section 10.

The sense amplifier enable signal generating circuit of the present invention also includes a power supply voltage variation detecting section 30 for detecting whether the power supply voltage $V_{cc}$ is changed to a low voltage or not, in accordance with a chip enable signal CE which is a control signal externally applied and generating a power supply voltage variation detection signal VE, a transfer section 40 for selectively transferring the delayed sense amplifier enable signal SE' delayed through the delay section 20, according to the detection signal VE of the power supply variation detecting section 30, and an output section 50 for receiving the sense amplifier enable signal SE generated from the sense amplifier enable signal generating section 10 and the delayed sense amplifier enable signal SE' through the transfer section 40, and generating an output signal $SE_{OUT}$ having a constant pulse width.

The power supply voltage variation detecting section 30 includes power supplying means 31 for supplying the power supply voltage $V_{cc}$ in accordance with the chip enable signal CE externally applied, voltage dividing means 32 for dividing the power supply voltage $V_{cc}$ applied from the power supplying means 31, and detecting means 33 for detecting whether the power supply voltage $V_{cc}$ divided through the voltage dividing means 32 is changed to a low voltage, and generating the power supply voltage variation detection signal VE to the transfer section 40.

In the power supply voltage variation detecting section 30, the power applying means 31 includes a first PMOS transistor MP31 which inputs the chip enable signal CE externally applied as a gate input signal and applies the power supply voltage $V_{cc}$ to the voltage dividing means 32.

The voltage dividing means 32 includes resistor means for dividing the power supply voltage $V_{cc}$ applied by the power supplying means 31, and the resistor means comprises a plurality of NMOS transistors MN31–MN34 which is connected between the power supply means 31 and ground in series.

The detecting means 33 includes: an inverting gate IN31 for receiving the divided power supply voltage through the voltage dividing means 32, and generating the detection signal VE of a high state when the power supply voltage $V_{cc}$ is changed to a low voltage within a desired range, and inverting gates IN32, IN33 for providing the detection signal VE from the inverting gate IN31 to the transfer means 40.

The transfer section 40 includes transfer means 41 for transferring the delayed sense amplifier enable signal SET from the delay section 20 to the output section 50 according to the detection signal VE of the power supply voltage variation detecting section 30, and shielding means 42 for shielding the output of the transfer means 41 from being transferred to the output section 50 according to the detection signal VE of the power supply voltage variation detecting section 30.

The transfer means 41 in the transfer section 40 has a first inverting means for inverting the sense amplifier enable signal SE' delayed through the delay section 20 according to the detection signal VE, and a second inverting means for inverting the output of the first inverting means and providing it to the output section 50.

The first inverting means includes an inverting gate IN42 for inverting the detection signal VE, first PMOS and NMOS transistors MP41 and MN41 where drains commonly connected and the output signal SE' of the delay section 20 is applied to gates, a second PMOS transistor MP42 where the inverted detection signal from the inverting gate IN42 is applied to a gate, a source is connected to the power supply voltage Vcc and a drain is connected to a source of the first PMOS transistor MP41, and a second NMOS transistor MN42 where the detection signal VE is applied to a gate, a drain is connected to a source of the first NMOS transistor MN41, and a source is grounded. The second inverting means includes an inverting gate IN41 for inverting the output signal of the first inverting means, and providing the inverted output signal to the output section 50.

The shielding means 42 in the transfer means 40 comprises a third PMOS transistor MP43 where the detection signal VE of the power supply voltage variation detecting section 30 is applied to a gate, the power supply voltage Vcc is applied to a source and drain is connected to an input of the inverting gate IN41.

The output section 50 includes a NOR gate NO51 for receiving the sense amplifier enable signal SE of the sense amplifier enable signal generating section 10 and the delayed sense amplifier enable signal SE' from the transfer section 40, and generating the logic NORed signal of two signals SE and SE' as the output signal $SE_{OUT}$ having the constant pulse width by performing logic NOR operation of two signals SE and SE' when the variation of the power supply voltage $V_{cc}$ is detected, or generating the sense amplifier enable signal SE of the sense amplifier enable signal generating section 10 as the output signal $SE_{OUT}$ when the variation of the power supply voltage $V_{cc}$ is not detected.

The operation of the sense amplifier enable signal generating circuit according to the present invention will be described below.

When an equalization signal EQ is externally applied to the sense amplifier enable signal generating circuit, the sense amplifier enable signal generating section 10 generates the sense amplifier enable signal SE via the delay chains 11–13 as shown in FIG. 1, providing it to the delay section 20 and the output section 50.

The delay section 20 delays the sense amplifier enable signal SE received from the sense amplifier enable signal generating section 10 by a desired pulse width and applies the delayed sense amplifier enable signal SE' to the transfer section 40.

On the other hand, the power supply voltage variation detecting section 30 receives the chip enable signal CE externally applied, turning on the first PMOS transistor MP31. The power supply voltage $V_{cc}$ is applied to the voltage dividing means 32 through the first PMQS transistor MP31 and divided via the NMOS transistors MN31–MN34.

At this time, the voltage of a node A is dropped according to threshold voltage of the NMOS transistor MN31-MN34 and the voltage distribution law and is linearly varied according to variation of the power supply voltage $V_{cc}$.

The power supply voltage divided through the voltage dividing means 32, that is, voltage of the node A is transferred to the detecting means 33 as an input. The detecting means 33 detects the variation of the power supply voltage $V_{cc}$.

In the detecting means 33, the inverting gate IN31 generates a logic signal of a high state or a low state in accordance with its logic threshold voltage. When the power supply voltage $V_{CC}$ is changed to a low Vcc within the designated range, for example, between 2.0 V and 3.1 V, the first inverting gate IN31 generates the logic high signal. Accordingly, the detecting means 33 generates the output signal of a high state to the transfer section 40 as the power supply voltage variation detection signal VE.

If the power supply voltage $V_{CC}$ is not changed to a low voltage, the output signal of the first inverting gate IN31 in the detecting means 33 is a low state and accordingly the detecting means 33 generates the detection signal VE of a low state, indicating that the power supply voltage $V_{cc}$ is not changed.

The detection signal VE of a low state is applied to the transfer section 40, turning on the third PMOS transistor MP43, and the second PMOS and NMOS transistors MP42 and MN42 are turned off. Accordingly, the transfer section 40 transfers not the delayed signal SE' from the delay section 20 but the signal of a low state through the inverting gate IN41 to the NOR gate NO51 in the output section 50.

As the power supply voltage $V_{cc}$ is not changed, the output section 50 generates the sense amplifier enable signal SE of the sense amplifier enable signal generating section 10 as an output signal $SE_{OUT}$ through the NOR gate NO51.

When the power supply voltage $V_{cc}$ is changed to a low voltage, the inverting gate IN31 receiving the voltage of the node A generates the output signal of a high state and the detecting means 33 outputs the detection signal of a high state. According to the detection signal VE of a high state from the detecting means 33, the third transistor MP43 is turned off and the second PMOS and NMOS transistors MP42 and MN42 are turned on.

The output signal SE' of the delay section 20 is applied to the NOR gate NO51 of the output section 50 through the transfer section 40.

The NOR gate NO51 of the output section 50 receives the sense amplifier enable signal SE from the sense amplifier enable signal generating section 10 and the delayed sense amplifier enable signal SE' through the transfer section 40, performs logic NOR operation of two signals SE and SE', and outputs the NORed signal as the output signal $SE_{OUT}$. Even when the power supply voltage $V_{cc}$ is changed to a low voltage, the sense amplifier enable signal SE' delayed by a desired pulse width through the delay section 20 is logic NORed with the sense amplifier enable signal SE from the sense amplifier enable signal generating section 10. Thus the present invention can generate the sense amplifier enable signal having the constant pulse width.

According to the sense amplifier enable signal generating circuit of the present invention, when the power supply voltage is not changed, the present invention normally generates a sense amplifier enable signal as an output signal. If the power supply voltage is changed to a low voltage, the sense amplifier enable signal generating circuit generates the logic NORed signal of a sense amplifier enable signal and a delayed sense amplifier enable signal as an output signal. Therefore, the circuit always generates a sense amplifier enable signal having a constant pulse width regardless of power supply voltage.

Accordingly, it is possible to prevent a malfunction caused by the variation of the power supply voltage, securing a sensing margin at a low power supply voltage and preventing an increase of the current consumption at a high power supply voltage.

It will be apparent to those skilled in the art that various modifications and variations can be made in a sense amplifier enable signal generating circuit in a semiconductor memory device according to the present invention without departing from the spirit or scope of the invention. Thus, it is intended that the present invention cover the modifications and variations of this invention provided they come within the scope of the appended claims and their equivalents.

What is claimed is:

1. A sense amplifier enable signal generating circuit of a semiconductor memory device, comprising:

generating means for receiving to an input signal externally applied, and generating a sense amplifier enable signal;

delay means for delaying the sense amplifier enable signal generated from the sense amplifier enable signal generating means;

detecting means for detecting the variation of a power supply voltage in accordance with a control signal externally applied, and generating a detection signal for the variation;

transfer means for transferring the delayed sense amplifier enable signal of the delay means in accordance with the detection signal generated from the power supply voltage variation detecting means; and output means for receiving the sense amplifier enable signal from the sense amplifier enable signal generating means and the delayed sense amplifier means from transfer means, and generating an output signal having a constant pulse width.

2. The sense amplifier enable signal generating circuit as defined in claim 1, wherein the sense amplifier enable signal generating means comprises multistage delay means for generating the sense amplifier enable signal by delaying an equalization signal applied as the input signal.

3. The sense amplifier enable signal generating circuit as defined in claim 1, wherein the delay means comprises delay chains for delaying the sense amplifier enable signal from the sense amplifier enable signal generating means by a desired pulse width.

4. The sense amplifier enable signal generating circuit as defined in claim 3, wherein each of the delay chains comprises:

an inverting gate for receiving the sense amplifier enable signal from the sense amplifier enable signal generating means; and a capacitor connected to the output of the inverting gate.

5. The sense amplifier enable signal generating circuit as defined in claim 1, wherein the power supply voltage variation detecting means comprises:

first means for supplying the power supply voltage in accordance with the control signal externally applied;

second means for dividing the power supply voltage supplied through the first means; and third means for receiving the divided power supply voltage from the second means, and detecting a variation of the power supply voltage.

6. The sense amplifier enable signal generating circuit as defined in claim 5, wherein the first means of the power supply voltage variation detecting means comprises a PMOS transistor driven by the control signal received at its gate to supply the power supply voltage to the second means.

7. The sense amplifier enable signal generating circuit as defined in claim 5, wherein the second means of the power supply voltage variation detecting means comprises a plurality of resistor means for dividing the power supply voltage supplied through the first means.

8. The sense amplifier enable signal generating circuit as defined in claim 7, wherein the resistor means are a plurality of NMOS transistors connected in series between the first means and the ground.

9. The sense amplifier enable signal generating circuit as defined in claim 5, wherein the third means of the power supply voltage variation detecting means comprises:

detecting means for receiving the divided power supply voltage through the second means, detecting the variation of the power supply voltage to a low voltage, and generating the detection signal; and buffer means for applying the detection signal of the detecting means to the transfer means.

10. The sense amplifier enable signal generating circuit as defined in claim 9, wherein the detecting means comprises an inverting gate for generating the detection signal of a high state when the power supply voltage is changed to a low voltage within a selected range.

11. The sense amplifier enable signal generating circuit as defined in claim 9, wherein the buffer means comprises a plurality of inverting gates connected in series for applying the detection signal to the transferring means.

12. The sense amplifier enable signal generating circuit as defined in claim 1, wherein the transfer means comprises:

first means for transferring the delayed sense amplifier enable signal of the delay means to the output means in accordance with the detection signal of the power supply voltage variation detecting means; and means for shielding the delayed sense amplifier enable signal of the delay means from being transferred to the output means in accordance with the detection signal of the power supply voltage variation detecting means.

13. The sense amplifier enable signal generating circuit as defined in claim 12, wherein the first means of the transfer means comprises:

a first inverting gate for inverting the detection signal from the power supply voltage variation detecting means;

first PMOS and NMOS transistors where the inverted detection signal from the first inverting gate and the detection signal of the power supply voltage variation detecting means are respectively applied to gates, and sources are respectively connected to the power supply voltage and the ground;

second PMOS and NMOS transistors where the delayed sense amplifier enable signal of the delay means is applied to gates, drains are commonly connected each other and sources are respectively connected to the drains of the first PMOS and NMOS transistors; and a second inverting gate where the drains of the second PMOS and NMOS transistors are connected to an input, and the output means is connected to an output.

14. The sense amplifier enable signal generating circuit as defined in claim 12, wherein the second means of the transfer means comprises a third PMOS transistor where the detection signal of the power supply voltage variation detecting means is applied to a gate, the power supply voltage is applied to a source, and the first means is connected to a drain.

15. The sense amplifier enable signal generating circuit as defined in claim 1, wherein the output means comprises a NOR gate for receiving the sense amplifier enable signal from the sense amplifier enable signal generating means and the delayed sense amplifier enable signal from the transfer means, and generating the output signal having the constant pulse width by performing logic NOR operation of two received signals.

16. A sense amplifier enable signal generating circuit of a semiconductor memory device, comprising:

generating means for receiving an equalization signal externally applied, and generating a sense amplifier enable signal;

delaying means for delaying the sense amplifier enable signal received from the sense amplifier enable signal generating means;

detecting means for detecting the variation of a power supply voltage to a low voltage in accordance with a control signal externally applied, and generating a detection signal;

transfer means for transferring the delayed sense amplifier enable signal of the delay means in accordance with the detection signal of the detecting means; and output means for receiving the sense amplifier enable signal of the sense amplifier enable signal generating means and the delayed sense amplifier enable signal of the delay means, and generating an output signal having a constant pulse width, wherein when the power supply voltage is changed to a low voltage, the transfer means transfers the delayed sense amplifier enable signal of the delay means to the output means in accordance with the detection signal, and the output means generates the logic NORed signal of the sense amplifier enable signal from the sense amplifier enable signal generating means and the delayed sense amplifier enable signal through the transfer means as the output signal; and when the power supply voltage is not changed to a low voltage, the transfer means shields the delayed sense amplifier enable signal of the delay means to be transferred to the output means, and the output means generates the sense amplifier enable signal of the sense amplifier enable signal generating means as the output signal.

* * * * *

UNITED STATES PATENT AND TRADEMARK OFFICE
CERTIFICATE OF CORRECTION

PATENT NO. : 6,009,030
DATED : December 28, 1999
INVENTOR(S) : M. Seo

Page 1 of 1

It is certified that error appears in the above-identified patent and that said Letters Patent is hereby corrected as shown below:

Column 3:
Line 14, cancel "he" and subtitute --the--; and
Line 2, prior to "includes", insert --n--.

Column 5:
Line 42, cancel "SET" and subtitute --SE'--.

Column 6:
Line 42, cancel "PMQS" and substitute --PMOS--.

Signed and Sealed this

Nineteenth Day of June, 2001

*Attest:*

*Nicholas P. Godici*

*Attesting Officer*

NICHOLAS P. GODICI
*Acting Director of the United States Patent and Trademark Office*